（12) United States Patent
de Raad et al.

(10) Patent No.: US 10,366,974 B2
(45) Date of Patent: Jul. 30, 2019

(54) ELECTROSTATIC DISCHARGE (ESD) PROTECTION DEVICE AND METHOD FOR OPERATING AN ESD PROTECTION DEVICE

(71) Applicant: NXP B.V., Eindhoven (NL)

(72) Inventors: Gijs Jan de Raad, Gelderland (NL); Da-Wei Lai, Nijmegen (NL)

(73) Assignee: NXP B.V., Eindhoven (NL)

( * ) Notice: Subject to any disclaimer, the term of this patent is extended or adjusted under 35 U.S.C. 154(b) by 243 days.

(21) Appl. No.: 15/595,068

(22) Filed: May 15, 2017

(65) Prior Publication Data

US 2018/0331090 A1 Nov. 15, 2018

(51) Int. Cl.
*H01L 27/02* (2006.01)
*H05K 9/00* (2006.01)
*H02H 9/04* (2006.01)
*H01L 29/78* (2006.01)

(52) U.S. Cl.
CPC ...... *H01L 27/0248* (2013.01); *H01L 27/0251* (2013.01); *H01L 27/0259* (2013.01); *H01L 27/0262* (2013.01); *H01L 29/7833* (2013.01); *H02H 9/046* (2013.01); *H05K 9/0067* (2013.01)

(58) Field of Classification Search
CPC ............. H01L 27/0248; H01L 27/0251; H01L 27/0259; H01L 27/0262; H02H 9/046
See application file for complete search history.

(56) References Cited

U.S. PATENT DOCUMENTS

| 5,359,211 | A | * | 10/1994 | Croft | ............... | H01L 27/0251 |
| | | | | | | 257/173 |
| 5,670,799 | A | * | 9/1997 | Croft | ............... | H01L 27/0251 |
| | | | | | | 257/173 |
| 5,754,381 | A | * | 5/1998 | Ker | ............... | H01L 27/0251 |
| | | | | | | 361/56 |
| 6,512,662 | B1 | | 1/2003 | Wang | | |

(Continued)

FOREIGN PATENT DOCUMENTS

EP 3107122 A1 12/2016

OTHER PUBLICATIONS

Utility Patent Application, entitled "Electrostatic Discharge Protection with Integrated Diode," U.S. Appl. No. 15/006,812, filed Jan. 16, 2016.

(Continued)

*Primary Examiner* — Scott Bauer

(57) ABSTRACT

Embodiments of an electrostatic discharge (ESD) protection device and a method of operating an ESD protection device are described. In one embodiment, an ESD protection device includes a bipolar transistor device connected between a first node and a second node, a series protection device connected in series with the bipolar transistor device, and a diode device connected between the second node and a third node. A drain terminal of an NMOS device to be protected is connectable to the first node. A body of the NMOS device to be protected is connectable to the second node. A source terminal of the NMOS device to be protected is connectable to the third node. The diode device and the bipolar transistor device are configured to form a parasitic silicon controlled rectifier. Other embodiments are also described.

20 Claims, 14 Drawing Sheets

(56) References Cited

U.S. PATENT DOCUMENTS

| | | | | |
|---|---|---|---|---|
| 6,825,504 | B2* | 11/2004 | Ishizuka | H01L 27/0262 257/107 |
| 6,894,881 | B1 | 5/2005 | Vaschencko et al. | |
| 8,633,543 | B2* | 1/2014 | Ohta | H01L 27/0262 257/127 |
| 9,042,065 | B2* | 5/2015 | Van Wijmeersch | H02H 9/046 361/111 |
| 2005/0213274 | A1* | 9/2005 | Wu | H01L 27/0262 361/91.1 |
| 2006/0262471 | A1* | 11/2006 | Van Camp | H01L 27/0262 361/56 |
| 2010/0044834 | A1 | 2/2010 | Park et al. | |
| 2014/0002934 | A1* | 1/2014 | Lai | H01L 27/0262 361/56 |
| 2014/0167104 | A1 | 6/2014 | Salcedo | |
| 2014/0363930 | A1* | 12/2014 | Bobde | H01L 29/866 438/133 |

OTHER PUBLICATIONS

Lai, Da-Wei et al; "PNP-eSCR ESD Protection Device with Tunable Trigger and Holding Voltage for High Voltage Applications"; IEEE Electrical Overstress/Electrostatic Discharge Symposium; 8 pages (2016).

Qi, Zhao et al; "High Holding Voltage SCR for Robust Electrostatic Discharge Protection"; Chinese Physical Review B, vol. 26, No. 7 (2017).

Scholz, Mirko et al; "Tuneable ESD clamp for high-voltage power I/O pins of a Battery Charge Circuit in mobile applications" IEEE European Solid-State Device Research Conference; pp. 248-251 (2017).

Zhan, Carol Rouying et al; "High-Performance Bi-directional SCR Developed on a 0.13 um SOI-based Smart Power Technology for Automotive Applications"; IEEE Electrical Overstress/Electrostatic Discharge Symposium; 7 pages (2017).

* cited by examiner

ELECTROSTATIC DISCHARGE (ESD) PROTECTION DEVICE AND METHOD FOR OPERATING AN ESD PROTECTION DEVICE

Embodiments of the invention relate generally to electronic hardware and methods for operating electronic hardware, and, more particularly, to electrostatic discharge (ESD) protection devices and methods for operating an ESD protection device.

An ESD protection device can be integrated into an integrated circuit (IC) chip to provide a low impedance channel to protect against thermal damage in the IC chip. During an ESD event such as an ESD strike or an ESD test, an ESD protection device shunts an ESD current pulse to protect a core circuit.

SUMMARY

Embodiments of an ESD protection device and a method of operating an ESD protection device are described. In one embodiment, an ESD protection device includes a bipolar transistor device connected between a first node and a second node, a series protection device connected in series with the bipolar transistor device, and a diode device connected between the second node and a third node. A drain terminal of an NMOS device to be protected is connectable to the first node. A body of the NMOS device to be protected is connectable to the second node. A source terminal of the NMOS device to be protected is connectable to the third node. The diode device and the bipolar transistor device are configured to form a parasitic silicon controlled rectifier (SCR). Other embodiments are also described.

In an embodiment, a distance between the diode device and the bipolar transistor device is shorter than a predefined threshold.

In an embodiment, the diode device overlaps with the bipolar transistor device.

In an embodiment, the diode device is formed within a boundary of the bipolar transistor device.

In an embodiment, the diode device is formed within a substrate contact ring of the bipolar transistor device.

In an embodiment, the series protection device is connected to the first node, and the bipolar transistor device is connected to the second node.

In an embodiment, the bipolar transistor device includes a PNP bipolar transistor or an NPN bipolar transistor.

In an embodiment, the bipolar transistor device includes a resistor connected between an emitter of the bipolar transistor device and a base of the bipolar transistor device.

In an embodiment, the series protection device includes a bipolar transistor or a diode.

In an embodiment, the bipolar transistor includes a resistor connected between an emitter of the bipolar transistor and a base of the bipolar transistor.

In an embodiment, the diode device includes at least one diode.

In an embodiment, the parasitic silicon controlled rectifier is configured to be inactive in response to an ESD pulse received between the first node and the second node.

In an embodiment, the parasitic silicon controlled rectifier is configured to be active in response to an ESD pulse received between the first node and the third node.

In an embodiment, an integrated circuit (IC) device includes the ESD protection device and the NMOS device to be protected.

In an embodiment, an ESD protection device includes a first PNP bipolar transistor connected between a first node and a second node, a second PNP bipolar transistor connected in series with the first PNP bipolar transistor, and a diode connected between the second node and a third node. A drain terminal of an NMOS device to be protected is connectable to the first node, a body of the NMOS device to be protected is connectable to the second node, and a source terminal of the NMOS device to be protected is connectable to the third node. The first PNP bipolar transistor and the diode are configured to form a parasitic silicon controlled rectifier. The diode is formed within a boundary of the first PNP bipolar transistor.

In an embodiment, the diode is formed within a substrate contact ring of the first PNP bipolar transistor.

In an embodiment, the second PNP bipolar transistor is connected to the first node, and the first PNP bipolar transistor is connected to the second node.

In an embodiment, the parasitic silicon controlled rectifier is configured to be inactive in response to an ESD pulse received between the first node and the second node and to be active in response to an ESD pulse received between the first node and the third node.

In an embodiment, the ESD protection device further includes a second diode connected to the first node and to the second PNP bipolar transistor.

In an embodiment, a method for operating an ESD protection device involves conducting a first ESD pulse received between a first node and a second node using at least one bipolar transistor device connected between the first node and the second node, where a drain terminal of an NMOS device to be protected is connectable to the first node, and where a body of the NMOS device to be protected is connectable to the second node, and conducting a second ESD pulse received between the first node and a third node that is connectable to a source terminal of the NMOS device to be protected. Conducting the second ESD pulse involves activating a parasitic silicon controlled rectifier formed by the bipolar transistor device and a diode device that is connected between the NMOS device to be protected and the third node.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
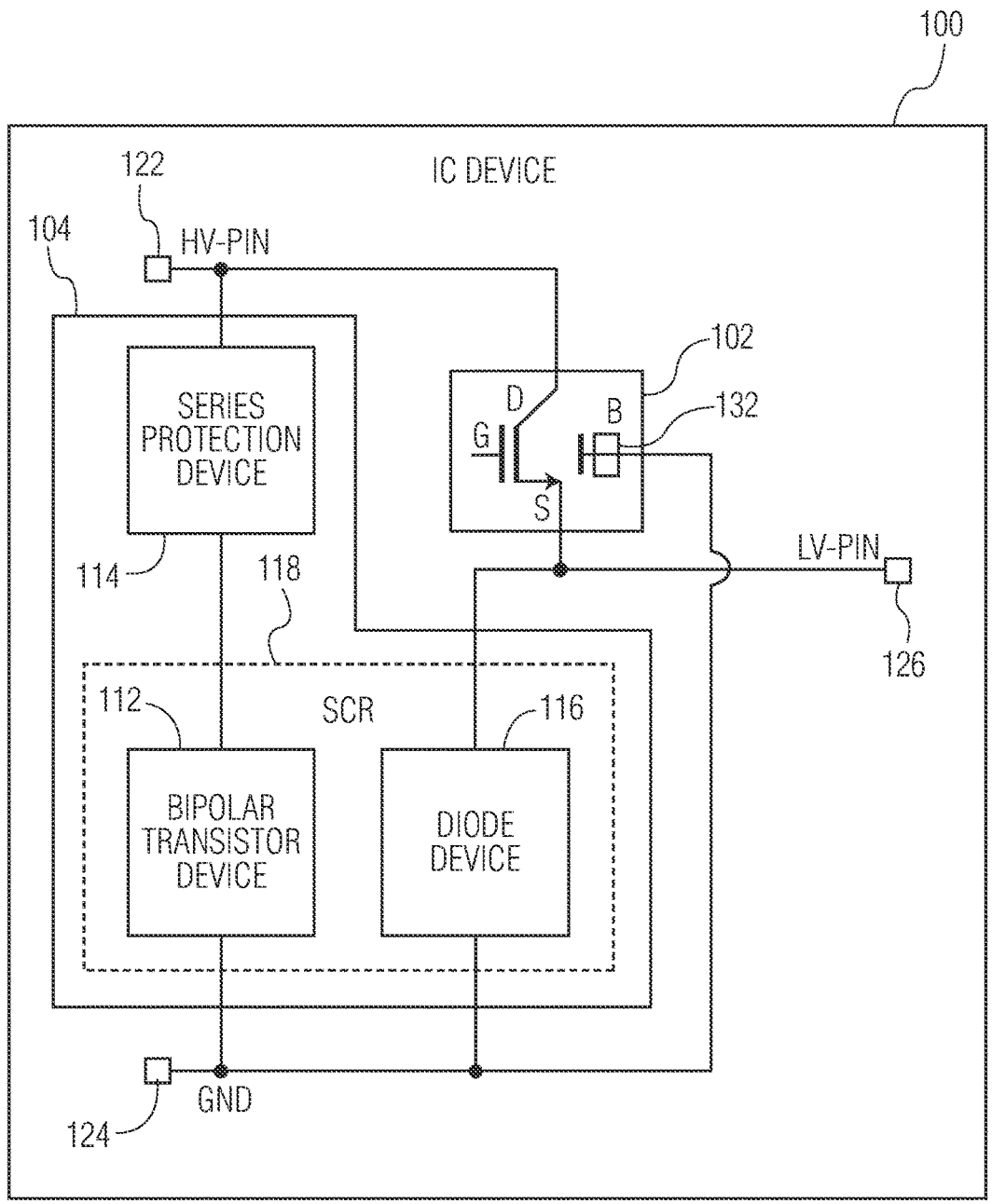
FIG. 1 is a schematic block diagram of an IC device in accordance with an embodiment of the invention.

FIG. 1 is a schematic block diagram of an IC device 100 in accordance with an embodiment of the invention. The IC device can be used in various applications, such as automotive applications, communications applications, industrial applications, medical applications, computer applications, and/or consumer or appliance applications. In the embodiment depicted in FIG. 1, the IC device includes an NMOS device 102 and an ESD protection device 104 that is used to protect the NMOS device during an ESD event, which may be an ESD test or an actual ESD strike. The IC device can be implemented in a substrate, such as a semiconductor wafer. In an embodiment, the IC device is packaged as a semiconductor IC chip. The IC device may be included in a microcontroller, which can be used for, for example, in vehicle control or communications, identification, wireless communications, and/or lighting control. In some embodiments, the IC device is included in a computing device, such as a smartphone, a tablet computer, a laptop, etc. For example, the IC device may be included in a Near Field Communications (NFC) capable computing device. Although the IC device is shown in FIG. 1 as including the NMOS device and the ESD protection device, in other embodiments, the IC device may include additional circuit elements. For example, the IC device may include a control circuit that is located in a low voltage domain and used to control the NMOS device, which is located in a high voltage domain, and/or a drive circuit that is used to drive the NMOS device.

In the embodiment depicted in FIG. 1, the NMOS device 102 and the ESD protection device 104 are connected between first, second, and third nodes 122, 124, 126 through which one or more ESD pulses may be received. The first, second, and third nodes may be coupled to different voltages. The first, second, and third nodes may be implemented as electrical terminals of the IC device, such as electrical contact pads or electrical contact pins of the IC device. In some embodiments, the first node is connected to a positive voltage and is referred to as a high voltage (HV) pin, the third node is connected to a voltage that is lower than the voltage at the first node and is referred to as a low voltage (LV) pin, and the second node is connected to the ground and is referred to as a ground (GND) pin.

The NMOS device 102 is susceptible to ESD strikes and is protected by the ESD protection device 104 in case of an ESD event. In the embodiment depicted in FIG. 1, the NMOS device includes a source terminal, "S," a gate terminal, "G," a body, "B," 132, and a drain terminal, "D." In some embodiments, the drain terminal, D, of the NMOS device is electrically connected to the first node 122, the body, B, of the NMOS device is electrically connected to the second node 124, and the source terminal, S, of the NMOS device is electrically connected to the third node 126. The gate terminal, G, of the NMOS device may be electrically connected to a drive circuit that is used to generate a drive voltage for the NMOS device. The NMOS device can be implemented by at least one suitable semiconductor device. In some embodiments, the NMOS device is an NMOS transistor. The NMOS device can be used in microcontrollers, transceivers, or switching circuits. In some embodiments, the IC device may include serially connected diodes that are coupled in parallel with the NMOS device for current restriction and voltage surge protection.

The ESD protection device 104 protects the NMOS device 102 during an ESD event. The ESD protection device can be used to protect a power supply domain of the IC device 100. For example, the ESD protection device may be connected to a power supply rail of the IC device 100. The ESD protection device can be implemented by suitable semiconductor devices. In the embodiment depicted in FIG. 1, the ESD protection device includes a bipolar transistor device 112, a series protection device 114, and a diode device 116. Although the ESD protection device is shown in FIG. 1 as including the bipolar transistor device, the series protection device, and the diode device, in other embodiments, the electrical device may include additional circuit elements. For example, the ESD protection device may include one or more additional transistors and/or resistors.

The bipolar transistor device 112 of the ESD protection device 104 is configured to shunt current in response to an ESD pulse. In the embodiment depicted in FIG. 1, the bipolar transistor device is connected between the first node 122 and the second node 124. The bipolar transistor device can be implemented by at least one suitable semiconductor device. In some embodiments, the bipolar transistor device is implemented by a bipolar transistor, which may be an NPN bipolar transistor or a PNP bipolar transistor.

The series protection device 114 of the ESD protection device 104 is connected in series with the bipolar transistor device 112. The series protection device is used to maintain the hold voltage of the ESD protection device at a level that is suitable for latch up (e.g., allows latch-up safe operation of the IC device 100 up to its intended operating voltage (e.g., 3-5 V)). The hold voltage of the ESD protection device may be the snapback holding voltage at which a breakdown condition occurs in the ESD protection device. In the embodiment depicted in FIG. 1, the series protection device is connected between the first node 122 and the bipolar transistor device. In some embodiments, the series protection device is connected between the second node 124 and the bipolar transistor device. The series protection device can be implemented using at least one suitable semiconductor device. In some embodiments, the series protection device is implemented using a bipolar transistor, which may be an NPN bipolar transistor or a PNP bipolar transistor. In some other embodiments, the series protection device is implemented using one or more diodes.

The diode device 116 of the ESD protection device 104 is connected between the second node 124 and the third node 126. In the embodiment depicted in FIG. 1, the diode device is connected to the source terminal, S, of the NMOS device 102 and to the third node. The diode device can be implemented using at least one suitable semiconductor device. For example, the diode device is implemented using one or more diodes.

In the embodiment depicted in FIG. 1, the diode device 116 and the bipolar transistor device 112 are configured to form a parasitic silicon controlled rectifier (SCR) 118. In some embodiments, the distance between the diode device and the bipolar transistor device is shorter than a predefined threshold. The diode device and the bipolar transistor device may be formed on the same substrate. In some embodiments, the diode device overlaps with the bipolar transistor device. For example, the diode device may be formed within the boundary (e.g., the packaging) of the bipolar transistor device. In some embodiments, the diode device is formed within a substrate contact ring of the bipolar transistor device.

The substrate contact ring may be made of one or more high electrical conductivity materials. In an embodiment, the substrate contact ring includes one or more low resistance layers (e.g., silicided layers) formed on the surface of the ESD protection device 104 for better connection with other circuits.

Figure 2:
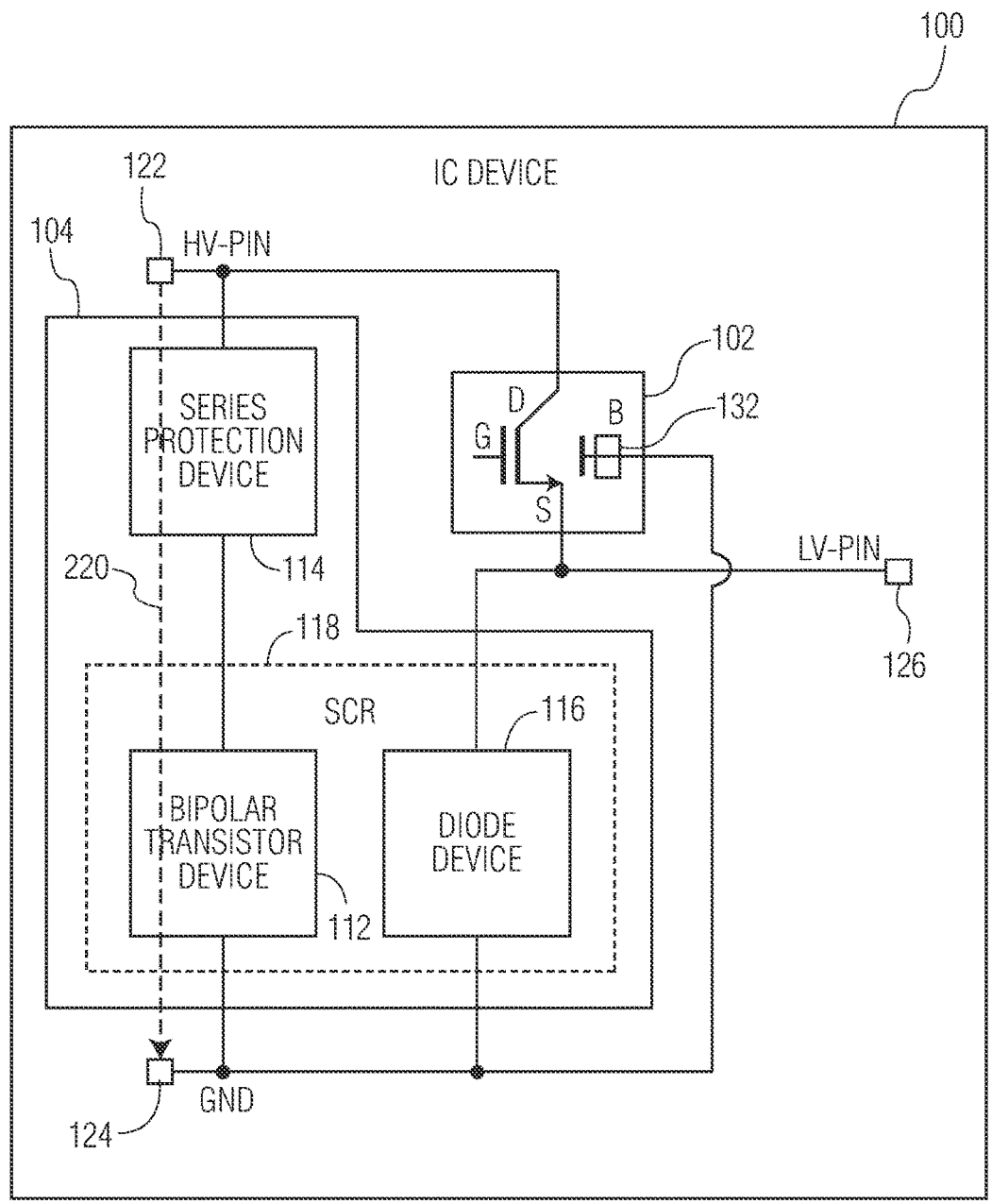
FIGS. 2 and 3 illustrate two examples of ESD current paths through the ESD protection device of the IC device during an ESD event.
Figure 3:
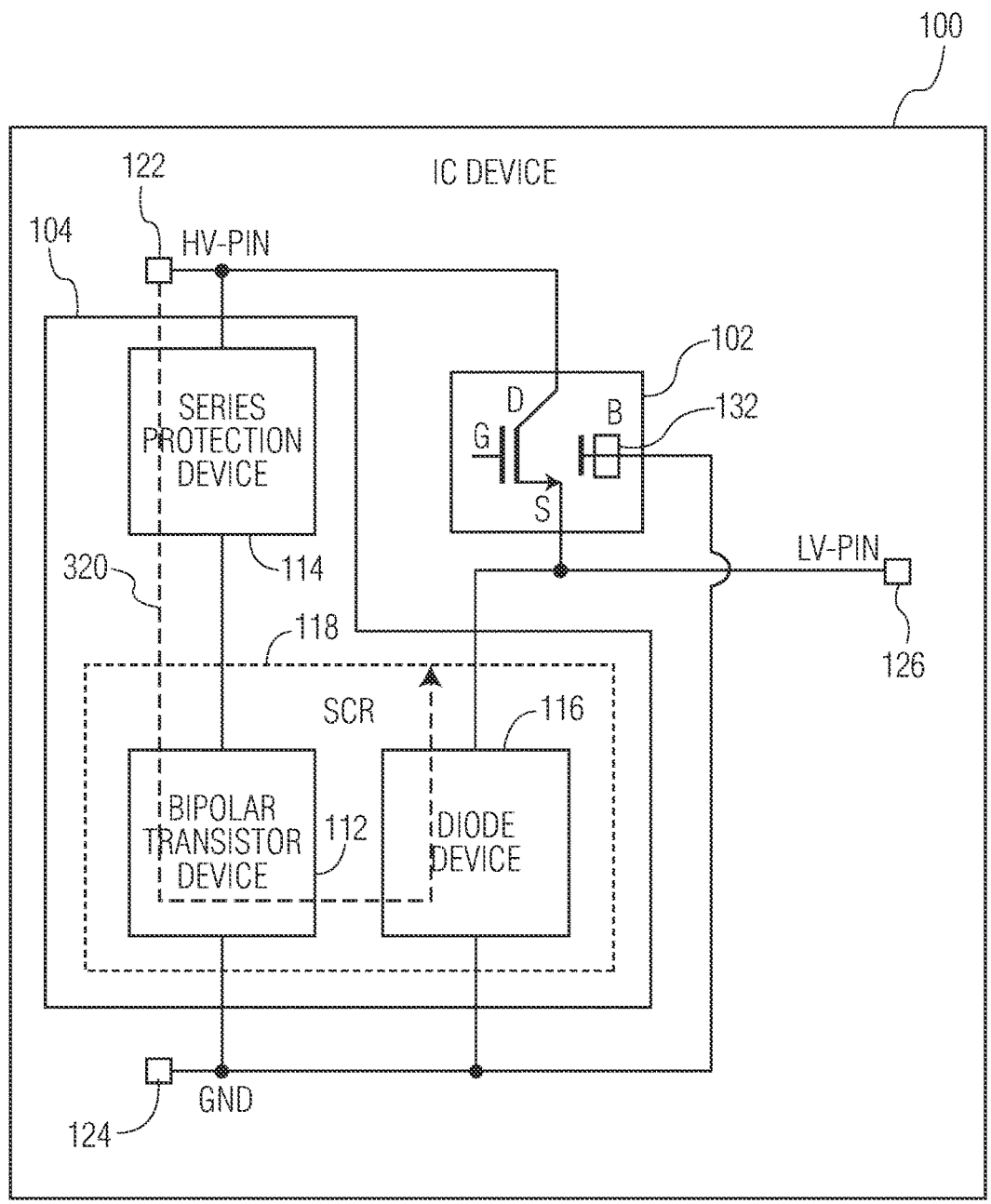

FIGS. 2 and 3 illustrate two examples of ESD current paths through the ESD protection device 104 of the IC device 100 during an ESD event. Specifically, FIG. 2 illustrates the ESD current path in the ESD protection device during an ESD pulse from the HV pin 122 to the GND pin 124. As illustrated in FIG. 2, when an ESD pulse is received between the HV pin and GND, ESD current 220 flows through the series protection device 114 and the bipolar transistor device 112. Consequently, the SCR 118 formed by the diode device 116 and the bipolar transistor device 112 is not activated. FIG. 3 illustrates the ESD current path in the ESD protection device during an ESD pulse from the HV pin to the LV pin 126. As illustrated in FIG. 3, when an ESD pulse is received between the HV pin and the LV pin, ESD current 320 flows through the series protection device 114, the bipolar transistor device 112 and the diode device, which activates the SCR formed by the diode device and the bipolar transistor device. Activating the parasitic SCR causes the shorting of the bipolar transistor device, which results in an operating voltage that is lower than the operating voltage during an ESD pulse from the HV pin to GND.

The NMOS device 102 may have a low fail voltage when stressed from the first node 122 to the third node 126 and a much higher fail voltage when stressed from the first node to the second node 124. The ESD protection device 104 depicted in FIG. 1 has a low operating voltage for ESD pulses received between the first node and the third node (e.g., lower than the fail voltage of the NMOS device) and allows a much higher DC stand-off voltage between the first node and the third node. The high DC stand-off voltage is beneficial for system robustness against over-voltages (e.g., a typical surge or a fault condition resulting in a DC voltage that is higher than intended operating voltage). Consequently, the ESD protection device provides adequate ESD protection for the NMOS device during an ESD strike from a high-voltage pin to a low-voltage pin as well as during an ESD strike from a high-voltage pin to the ground.

Figure 4:
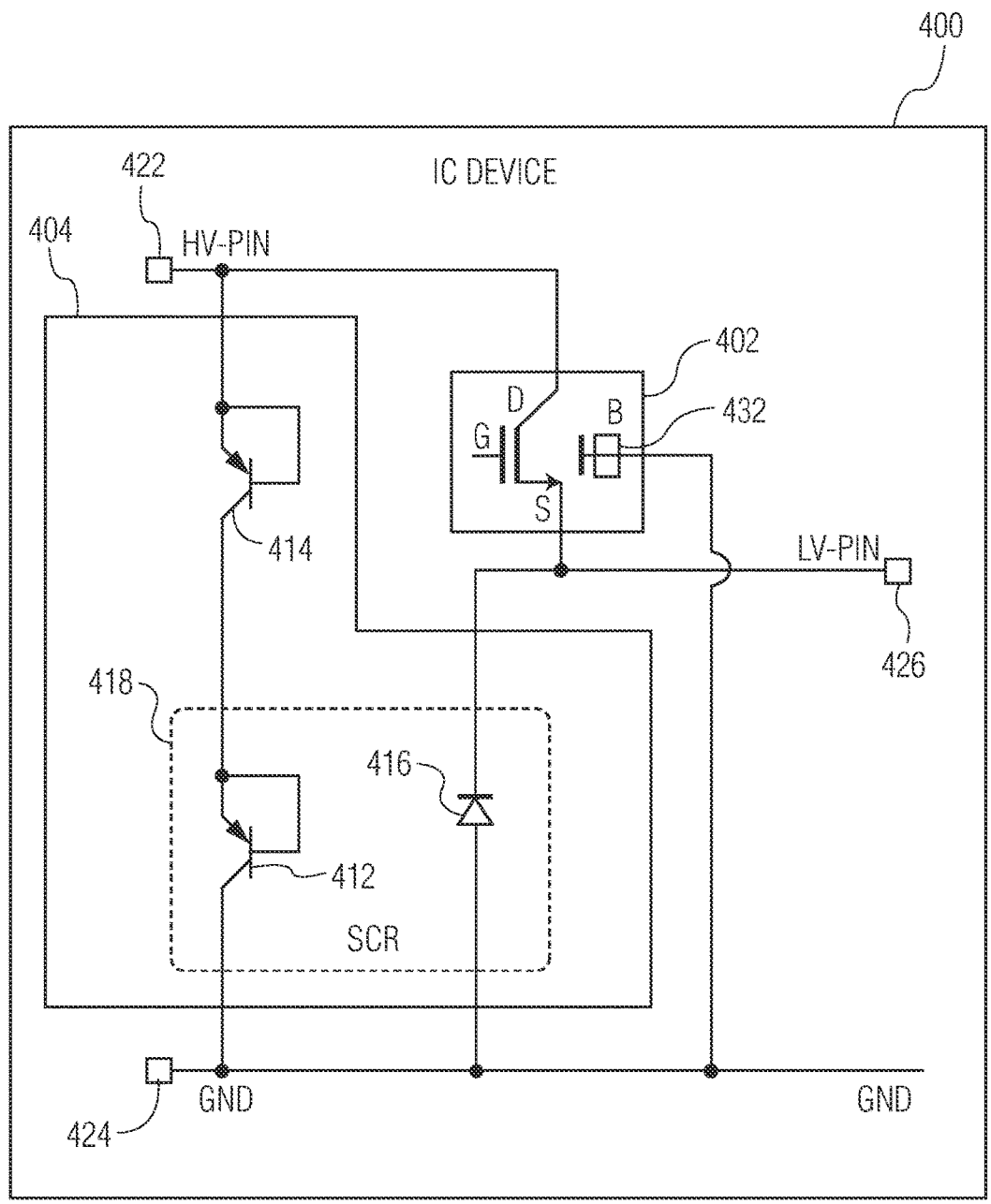
FIG. 4 depicts an embodiment of the IC device depicted in FIG. 1.

FIG. 4 depicts an embodiment of the IC device 100 depicted in FIG. 1. In the embodiment depicted in FIG. 4, an IC device 400 includes an extended drain N-type MOSFET (EDNMOS) transistor 402 and an ESD protection device 404, which includes a first PNP bipolar transistor 412, a second PNP bipolar transistor 414, and a diode 416. The EDNMOS transistor includes a source terminal, "S," a gate terminal, "G," a body, "B," 432, and a drain terminal, "D." In some embodiments, the EDNMOS transistor is configured as a source follower to create a low-voltage supply or is implemented in a data switch that is robust against high voltage. In the embodiment depicted in FIG. 4, the drain terminal, D, of the EDNMOS transistor is electrically connected to a HV pin 422 and to the second PNP bipolar transistor, the body, B, of the EDNMOS transistor is electrically connected to a ground (GND) pin 424, to the first PNP bipolar transistor, and to the diode, and the source terminal, S, of the EDNMOS transistor is electrically connected to a LV pin 426 and to the diode. The EDNMOS transistor, the ESD protection device 404, the first PNP bipolar transistor, the second PNP bipolar transistor, and the diode of the IC device 400 depicted in FIG. 4 are embodiments of the NMOS device 102, the ESD protection device 104, the bipolar transistor device 112, the series protection device 114, and the diode device 116 of the IC device 100 depicted in FIG. 1, respectively. The IC device depicted in FIG. 4 is a possible implementation of the IC device 100 depicted in FIG. 1. However, the IC device depicted in FIG. 1 can be implemented differently from the IC device depicted in FIG. 4.

In the embodiment depicted in FIG. 4, the diode 416 and the first bipolar transistor 412 are configured to form a parasitic silicon controlled rectifier (SCR) 418. In an example operation of the ESD protection device 404, when an ESD pulse is received between the HV pin and GND, ESD current flows through the second PNP bipolar transistor 414 and the first PNP bipolar transistor 412. Consequently, the SCR 418 formed by the diode and the first PNP bipolar transistor is not activated. In addition, when an ESD pulse is received between the HV pin and the LV pin, ESD current flows through the second PNP bipolar transistor, the first PNP bipolar transistor, and the diode, which activates the SCR 418.

Figure 5:
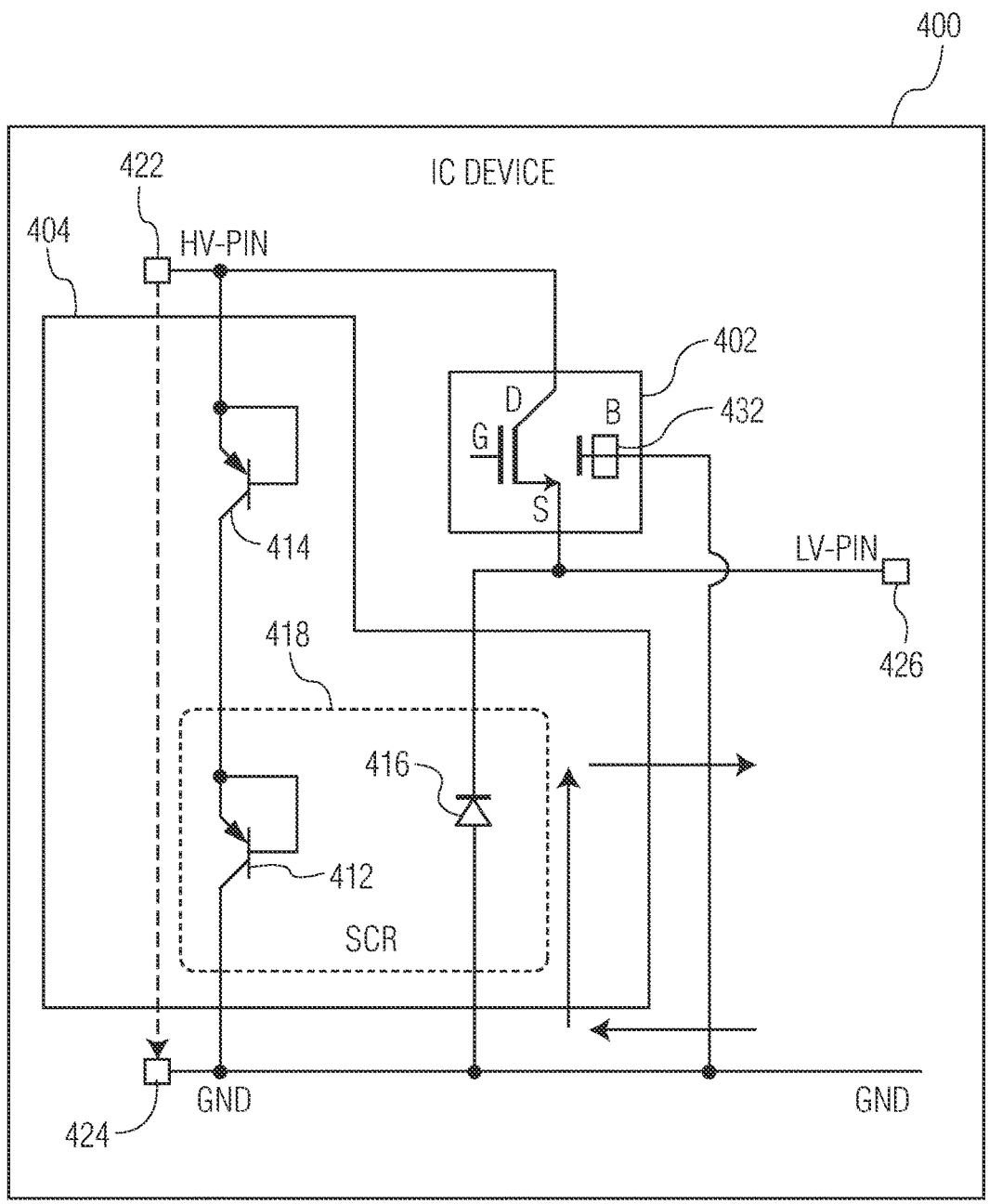
FIGS. 5-7 illustrate three examples of test latch-up scenarios for the ESD protection device depicted in FIG. 4.
Figure 6:
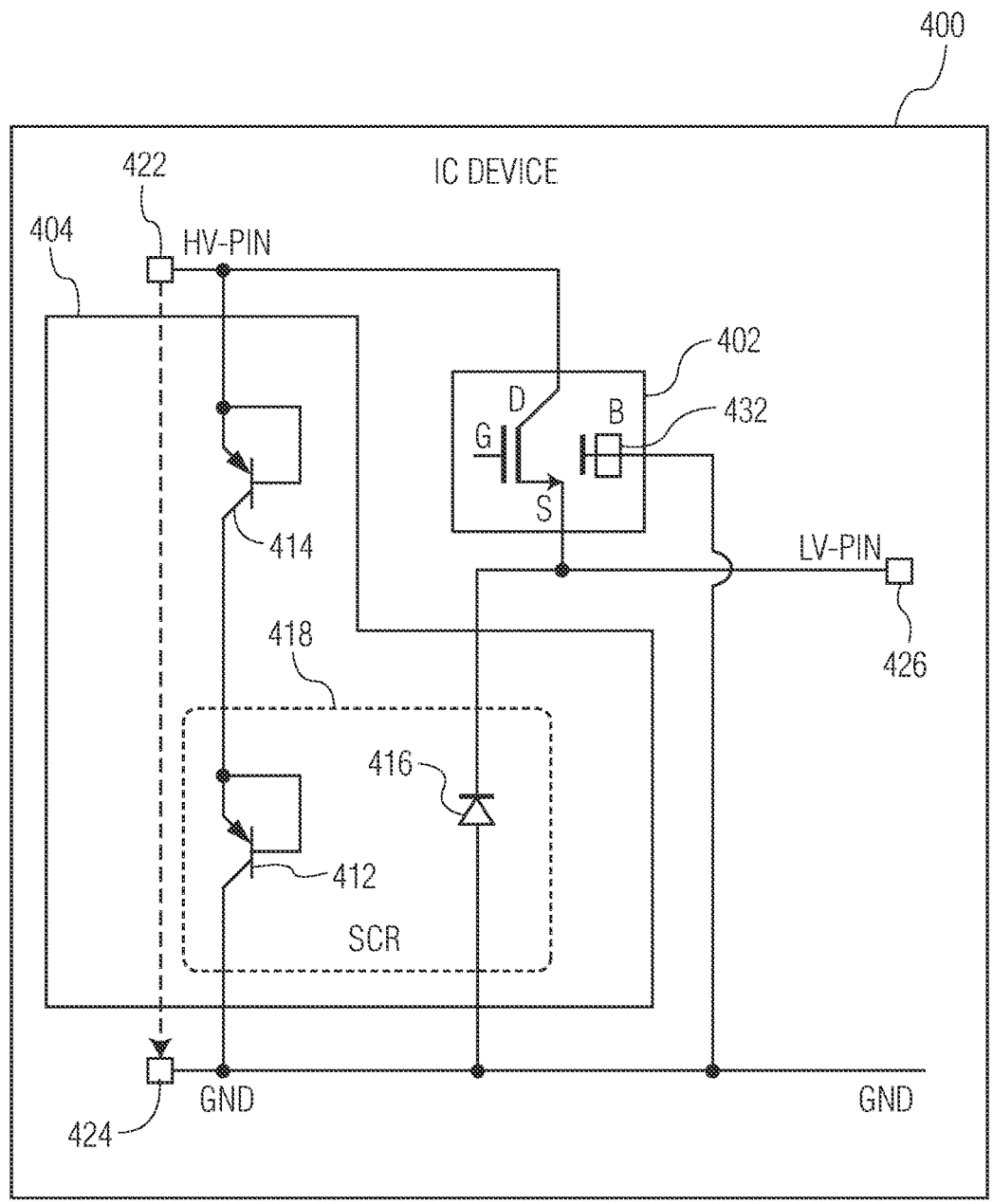
Figure 7:
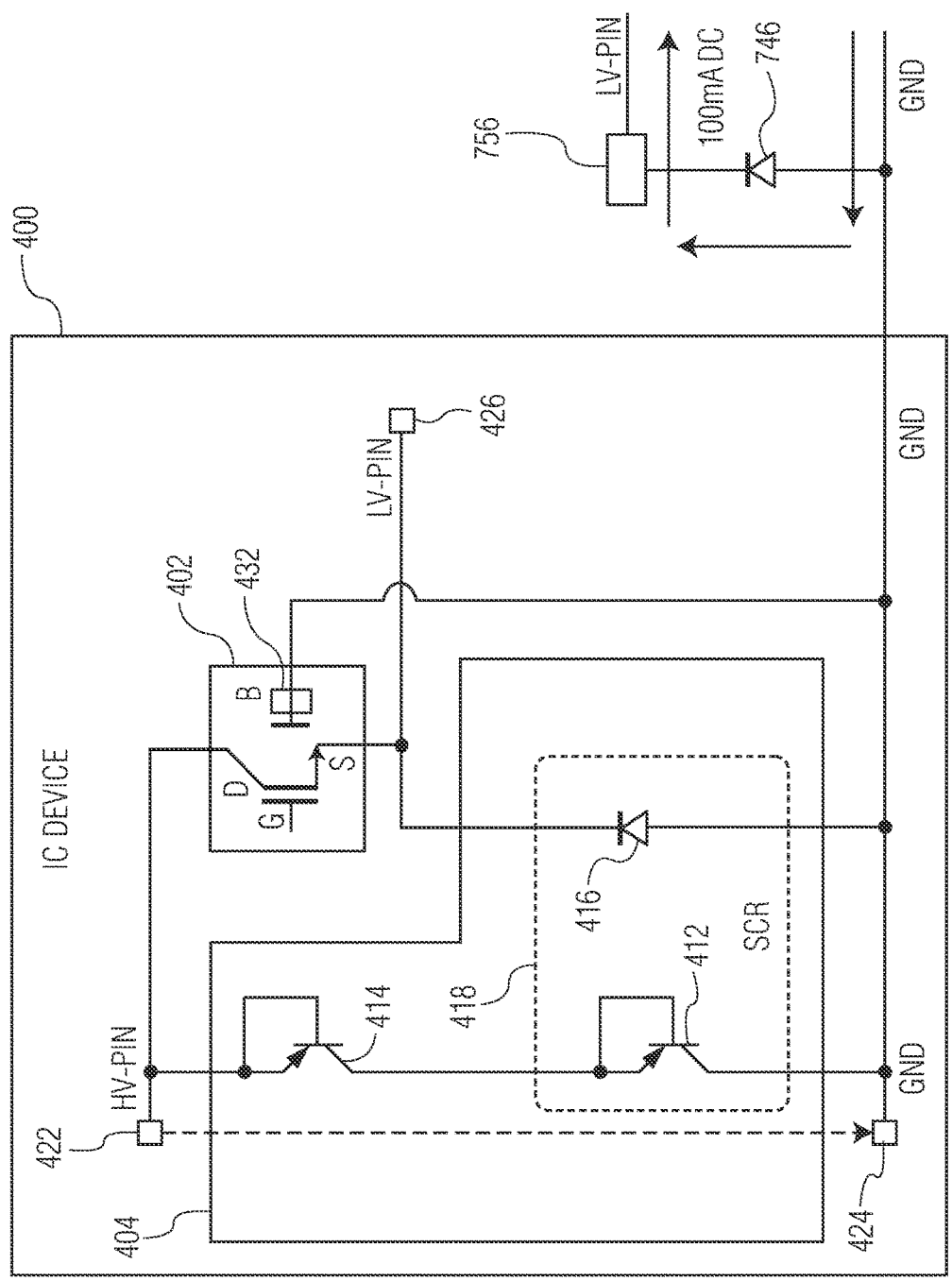

In addition to providing ESD protection for the EDNMOS transistor 402, the ESD protection device 404 can also meet latch-up safety requirements. The ESD protection device can be used for IC devices that operate at a relatively low operating voltage, but require a higher DC stand-off voltage for system robustness. FIGS. 5-7 illustrate three examples of latch-up scenarios for the ESD protection device depicted in FIG. 4. In particular, FIG. 5 illustrates a latch-up scenario for the ESD protection device where the HV pin is held at a normal operating voltage while a DC current (e.g., 100 mA) is pulled from the LV pin. The ESD protection device can withstand the latch-up scenario illustrated in FIG. 5. In particular, in the ESD protection device 404, the latch-up test voltage (e.g., the specified DC-stand-off voltage with respect to GND) at the HV pin is less than the sum of the hold voltages of the SCR and the second PNP bipolar transistor. The hold voltage of the SCR may be the snapback holding voltage at which a self-sustained current can flow in the SCR while the hold voltage of the second PNP bipolar transistor may be the snapback holding voltage at which a self-sustained current can flow in the second PNP bipolar transistor. For example, the latch-up test voltage at the HV pin is limited to 13 V while the sum of the hold voltages of the SCR and the second PNP bipolar transistor is above 13 V.

FIG. 6 illustrates a latch-up scenario for the ESD protection device 404 where an overvoltage is applied to the HV pin. The ESD protection device can withstand the latch-up scenario illustrated in FIG. 6. In particular, in the ESD protection device 404, the HV pin does not latch or sustain damage. The overvoltage can be limited to the Absolute Maximum Rating (AMR) listed for that HV pin. The latch-up test voltage (e.g., the specified DC-stand-off voltage with respect to GND) at the HV pin is less than the sum of the hold voltages of the SCR and the second PNP bipolar transistor. For example, the latch-up test voltage at the HV pin is limited to 26 V while the sum of the hold voltages of the SCR and the second PNP bipolar transistor is above 26 V.

FIG. 7 illustrates a latch-up scenario for the ESD protection device where the HV pin is held at a normal operating voltage while a DC current (e.g., 100 mA) is pulled from an LV pin 756 that is not connected to the HV pin via the EDNMOS transistor 402. In the latch-up scenario illustrated in FIG. 7, the LV pin 756 is connected to the ground (GND) through a diode 746. The ESD protection device can withstand the latch-up scenario depicted in FIG. 7. In particular, in the ESD protection device 404, the latch-up test voltage (e.g., the specified DC-stand-off voltage with respect to GND) at the HV pin is less than the sum of the hold voltages of the SCR and the second PNP bipolar transistor. For example, the latch-up test voltage at the HV pin is limited to 26 V while the sum of the hold voltages of the SCR and the second PNP bipolar transistor is above 26 V.

Figure 8:
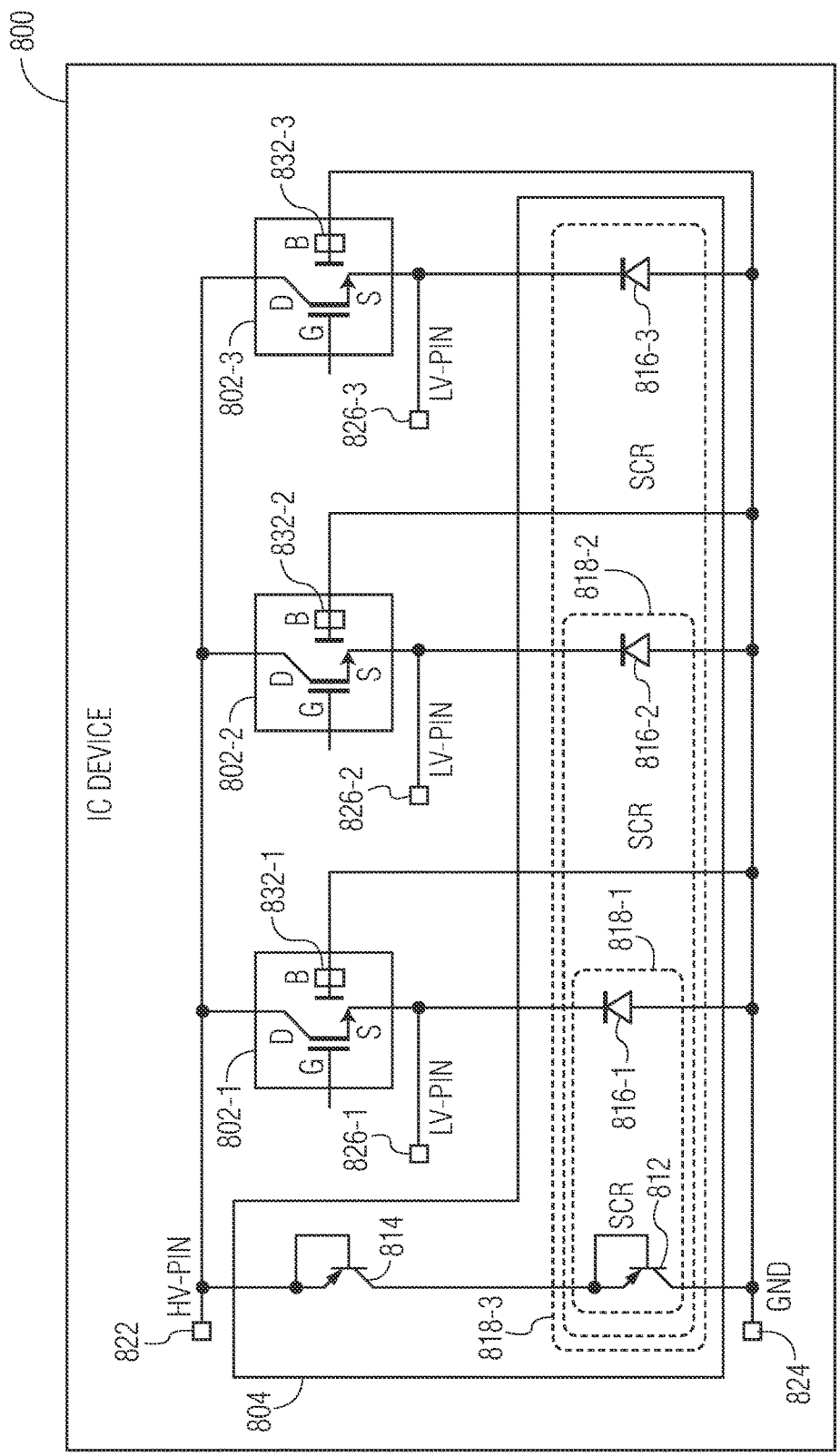
FIG. 8 depicts an IC device having three extended drain N-type MOSFET (EDNMOS) transistors in accordance with an embodiment of the invention.

FIG. 8 depicts an IC device 800 having three EDNMOS transistors 802-1, 802-2, 802-3 in accordance with an embodiment of the invention. In the embodiment depicted in FIG. 8, the IC device includes three EDNMOS transistors 802-1, 802-2, 802-3 and an ESD protection device 804, which includes a first PNP bipolar transistor 812, a second PNP bipolar transistor 814, and three diodes 816-1, 816-2, 816-3. Each EDNMOS transistor includes a source terminal, "S," a gate terminal, "G," a body, "B," 832-1, 832-2, or 832-3, and a drain terminal, "D." In the embodiment depicted in FIG. 8, the drain terminal, D, of each EDNMOS transistor is electrically connected to a HV pin 822 and to the second PNP bipolar transistor, the body, B, of each EDNMOS transistor is electrically connected to the ground (GND) pin 824, to the first PNP bipolar transistor, and to a respective diode, and the source terminal, S, of each EDNMOS transistor is electrically connected to an LV pin 826 and to a respective diode. The EDNMOS transistors, the ESD protection device 804, the first PNP bipolar transistor, the second PNP bipolar transistor, and the diodes of the IC device 800 depicted in FIG. 8 are embodiments of the NMOS device 102, the ESD protection device 104, the bipolar transistor device 112, the series protection device 114, and the diode device 116 of the IC device 100 depicted in FIG. 1, respectively. The IC device depicted in FIG. 8 is a possible implementation of the IC device 100 depicted in FIG. 1. However, the IC device depicted in FIG. 1 can be implemented differently from the IC device depicted in FIG. 8.

In the embodiment depicted in FIG. 8, the diode 816-1 and the first bipolar transistor 812 are configured to form a first parasitic SCR 818-1, the diode 816-2 and the first bipolar transistor are configured to form a second parasitic SCR 818-2, and the diode 816-3 and the first bipolar transistor are configured to form a third parasitic SCR 818-3. In an example operation of the ESD protection device 804, when an ESD pulse is received between the HV pin and GND, ESD current flows through the second PNP bipolar transistor 814 and the first PNP bipolar transistor 812. Consequently, the SCRs 818-1, 818-2, and 818-3 formed by the diodes and the first PNP bipolar transistor are not activated. In addition, when an ESD pulse is received between the HV pin and a respective LV pin, ESD current flows through the second PNP bipolar transistor, the first PNP bipolar transistor, and a respective diode, which activates a respective SCR.

Figure 9:
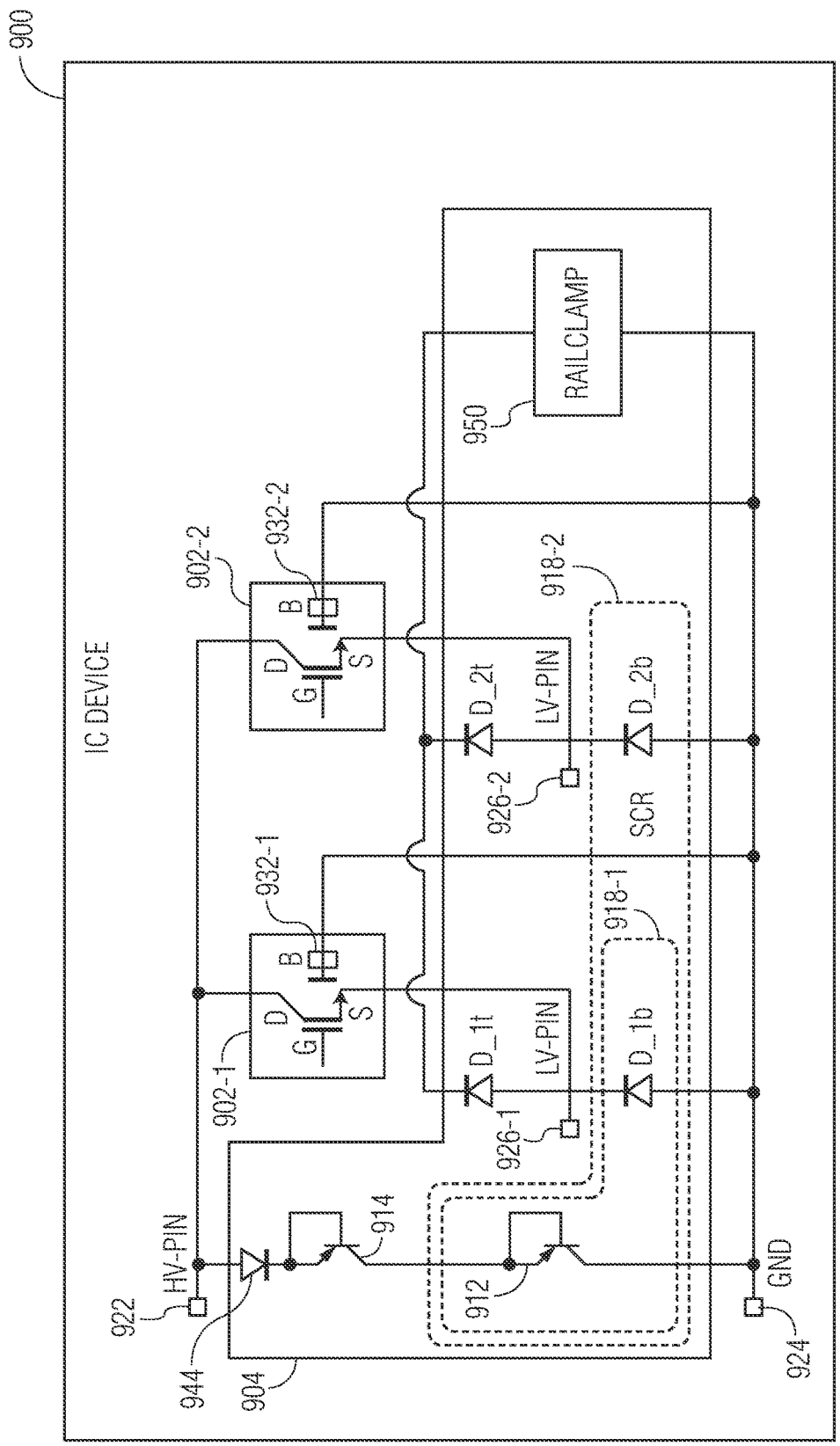
FIG. 9 depicts an IC device having two EDNMOS transistors in accordance with an embodiment of the invention.

FIG. 9 depicts an IC device 900 having two EDNMOS transistors 902-1, 902-2 in accordance with an embodiment of the invention. In the embodiment depicted in FIG. 9, the IC device includes the two EDNMOS transistors and an ESD protection device 904, which includes a series diode 944, a first PNP bipolar transistor 912, a second PNP bipolar transistor 914, four diodes, "D_1$b$," "D_2$b$," "D_1$t$," and "D_2$t$," and an ESD railclamp 950. In some embodiments, the ESD railclamp includes a combination of a bigFET and a trigger device for the bigFET. The ESD railclamp can be used to protect a supply domain of the IC device from sustaining damage (e.g., overheating or overvoltage) during an ESD strike by shunting the ESD current from the supply domain to the ground domain. In the embodiment depicted in FIG. 9, each EDNMOS transistor 902-1 or 902-2 includes a source terminal, "S," a gate terminal, "G," a body, "B," 932-1, or 932-2, and a drain terminal, "D." The drain terminal, D, of each EDNMOS transistor is electrically connected to a HV pin 922, the body, B, of each EDNMOS transistor is electrically connected to the ground (GND) pin 924, to the first PNP bipolar transistor, and to a respective diode, D_1$b$, or D_2$b$, and the source terminal, S, of each EDNMOS transistor is electrically connected to an LV pin 826 and to respective diodes. The EDNMOS transistors, the ESD protection device 804, the first PNP bipolar transistor, the second PNP bipolar transistor, and the diodes of the IC device 900 depicted in FIG. 9 are embodiments of the NMOS device 102, the ESD protection device 104, the bipolar transistor device 112, the series protection device 114, and the diode device 116 of the IC device 100 depicted in FIG. 1, respectively. The IC device depicted in FIG. 9 is a possible implementation of the IC device 100 depicted in FIG. 1. However, the IC device depicted in FIG. 1 can be implemented differently from the IC device depicted in FIG. 9.

In the embodiment depicted in FIG. 9, the diode D_1b and the first bipolar transistor 912 are configured to form a first parasitic SCR 918-1, and the diode D_2b and the first bipolar transistor are configured to form a second parasitic SCR 918-2. In an example operation of the ESD protection device 904, when an ESD pulse is received between the HV pin and GND, ESD current flows through the series diode 944, the second PNP bipolar transistor 914, and the first PNP bipolar transistor 912. Consequently, the SCRs 918-1 and 918-2 formed by the diodes and the first PNP bipolar transistor are not activated. In addition, when an ESD pulse is received between the HV pin and a respective LV pin, ESD current flows through the series diode, the second PNP bipolar transistor, the first PNP bipolar transistor, and respective diodes, which activates a respective SCR. The ESD protection device 904 has a relatively high operating voltage during an ESD pulse from the HV pin to GND and a lower operating voltage during an ESD pulse from the HV pin to the LV pin.

Figure 10:
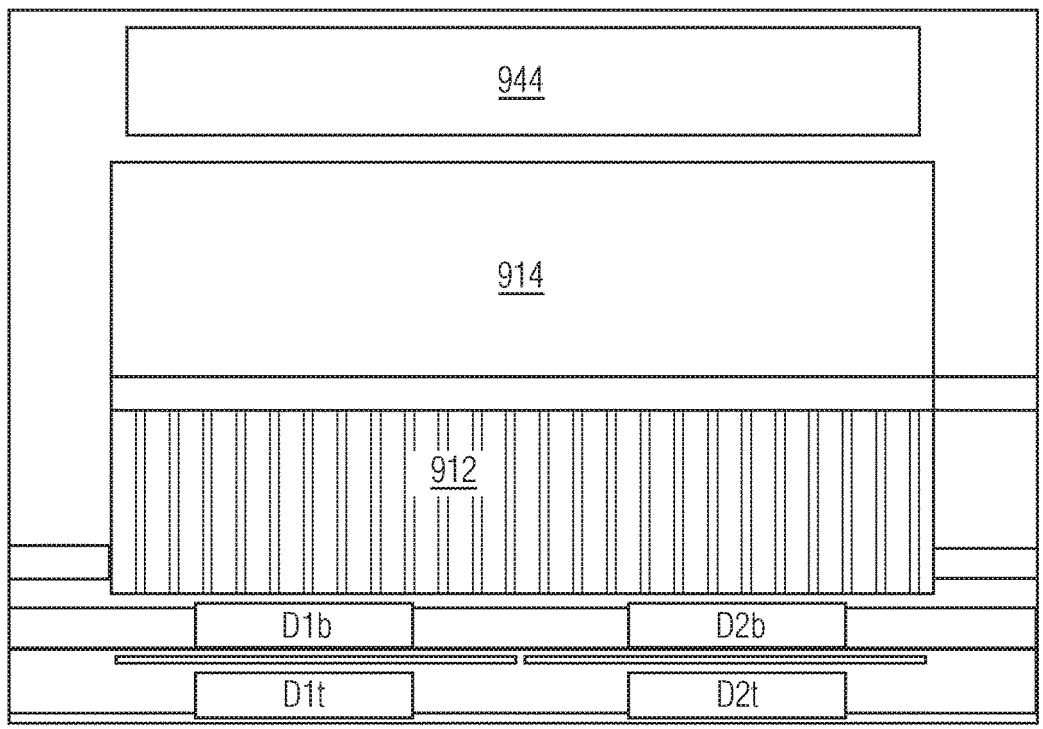
FIG. 10 depicts a partial top layout view of the ESD protection device depicted in FIG. 9 in accordance with an embodiment of the invention.

FIG. 10 depicts a partial top layout view of the ESD protection device 904 depicted in FIG. 9 in accordance with an embodiment of the invention. In the partial top layout view depicted in FIG. 10, the ESD protection device includes at least the series diode 944, the first PNP bipolar transistor 912, the second PNP bipolar transistor 914, and the four diodes, D_1b, D_2b, D_1t, and D_2t. The diodes, D_1b, D_2b, overlap with the first PNP bipolar transistor 912 such that the substrate area of the diodes, D_1b, D_2b is part of the substrate area of the first
PNP bipolar transistor 912.

Figure 11:
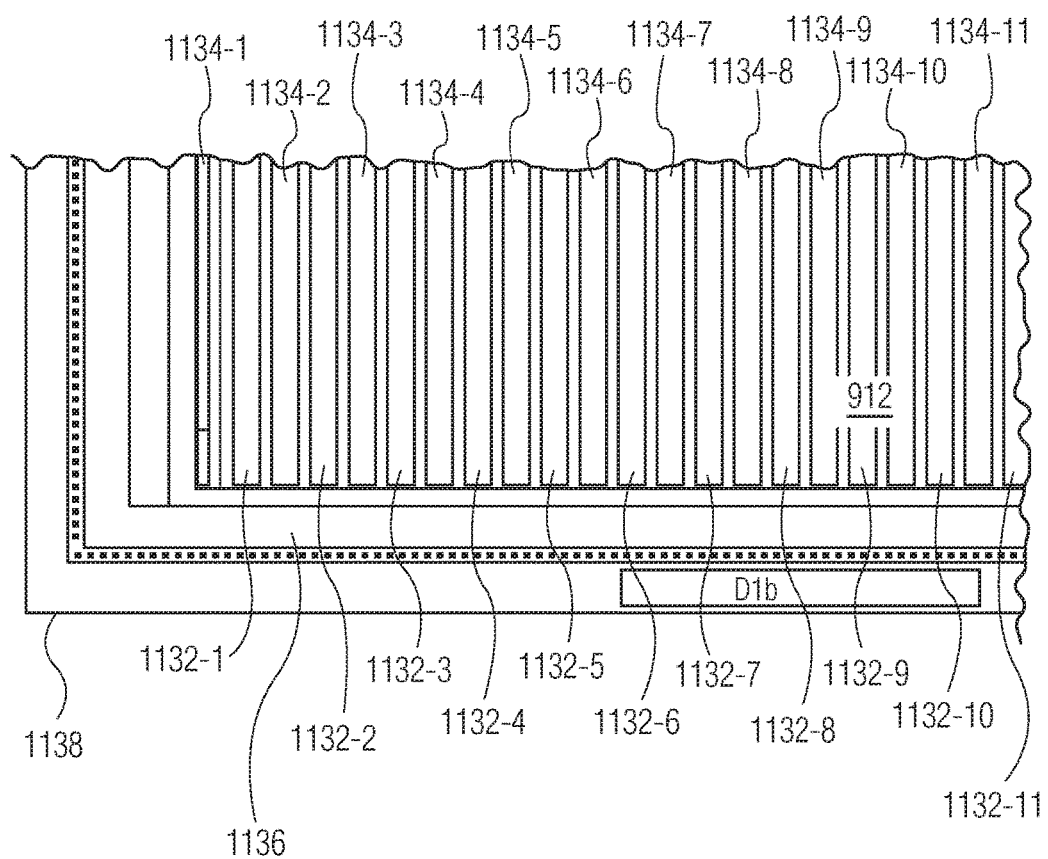
FIG. 11 depicts a section of the partial ESD protection device depicted in FIG. 10.

FIG. 11 depicts a section of the partial ESD protection device 904 depicted in FIG. 10. In the section depicted in FIG. 11, the first PNP bipolar transistor 912 includes collector components 1132-1, 1132-2, 1132-3, 1132-4, 1132-5, 1132-6, 1132-7, 1132-8, 1132-9, 1132-10, 1132-11, emitter components 1134-1, 1134-2, 1134-3, 1134-4, 1134-5, 1134-6, 1134-7, 1134-8, 1134-9, 1134-10, 1134-11 that are alternately located with respect to the collector components, a base structure 1136 and a substrate contact ring 1138. In some embodiments, the substrate contact ring is used to capture holes that are accidentally injected into the substrate and/or ensure that the electric field inside the ESD protection device is contained within the edges of the ESD protection device, and does not affect neighboring semiconductor devices. For example, the substrate contact ring forces zero potential around the edges of the ESD protection device such that there is no electric field protruding from the ESD protection device. The substrate contact ring may be made of one or more high electrical conductivity materials. The substrate contact ring may include low resistance layers (e.g., silicided layers) formed on the surface of the ESD protection device for better connection with other circuits. The diode, D_1b, is formed within the substrate contact ring of the first PNP bipolar transistor 912 such that the substrate area of the diode, D_1b, is part of the substrate area of the substrate contact ring of the first PNP bipolar transistor 912. Because the diode, D_1b, is formed within the substrate contact ring of the first PNP bipolar transistor, the diode, D_1b, and the first PNP bipolar transistor form a parasitic silicon controlled rectifier (SCR).

Figure 12:
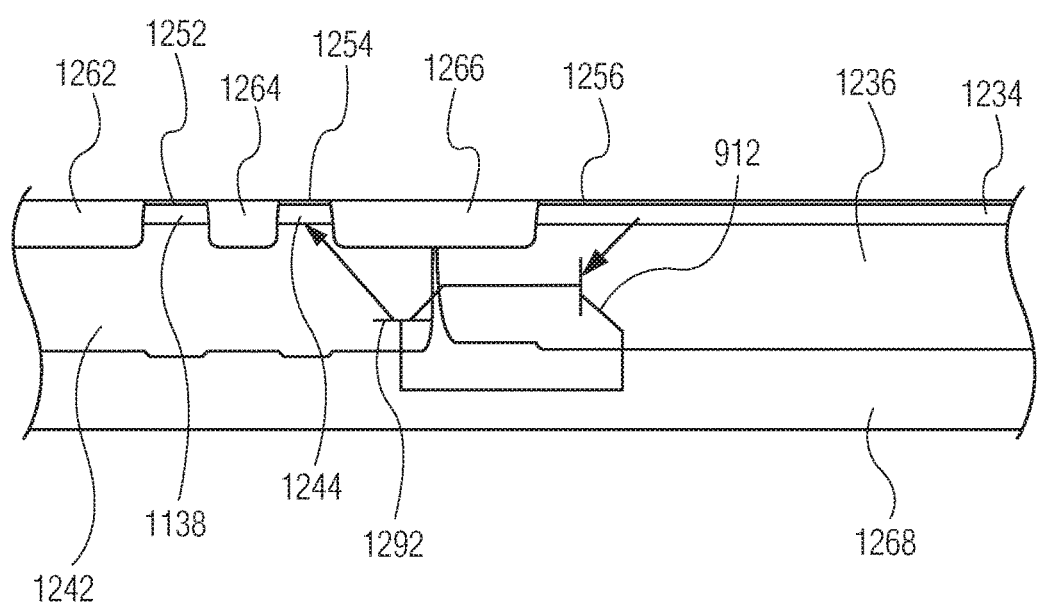
FIG. 12 depicts a cross sectional view of the ESD protection device depicted in FIG. 9 in accordance with an embodiment of the invention.

FIG. 12 depicts a cross sectional view of the ESD protection device 904 depicted in FIG. 9 in accordance with an embodiment of the invention. In the cross-sectional view of FIG. 12, the substrate contact ring 1138 and an active region 1244 are formed on top of (e.g., in direct contact with) a P-well region 1242 while an emitter region 1234 is formed on top of (e.g., in direct contact with) a base region 1236. Contact regions 1252, 1254, 1256 may be formed on top of (e.g., in direct contact with) the first active region, the second active region, and the emitter region, respectively. The contact regions 1252, 1254 may be connected to the ground pin 924 and to the LV pin 926 (shown in FIG. 9), respectively. The contact regions may include low resistance layers (e.g., silicided layers) formed on the surface of the ESD protection device for better connection with other circuits. Isolator regions (e.g., shallow trench isolation regions filled with oxide or other isolation material) 1262, 1264, 1266 are formed on top of (e.g., in direct contact with) the P-well region and the base region, respectively. The P-well region and the base region may be formed on top of (e.g., in direct contact with) a substrate 1258, which may be a silicon substrate region. As shown in FIG. 12, the first PNP bipolar transistor 912 operates with a parasitic NPN bipolar transistor 1292 formed within the P-well region and the base region.

Figure 13:
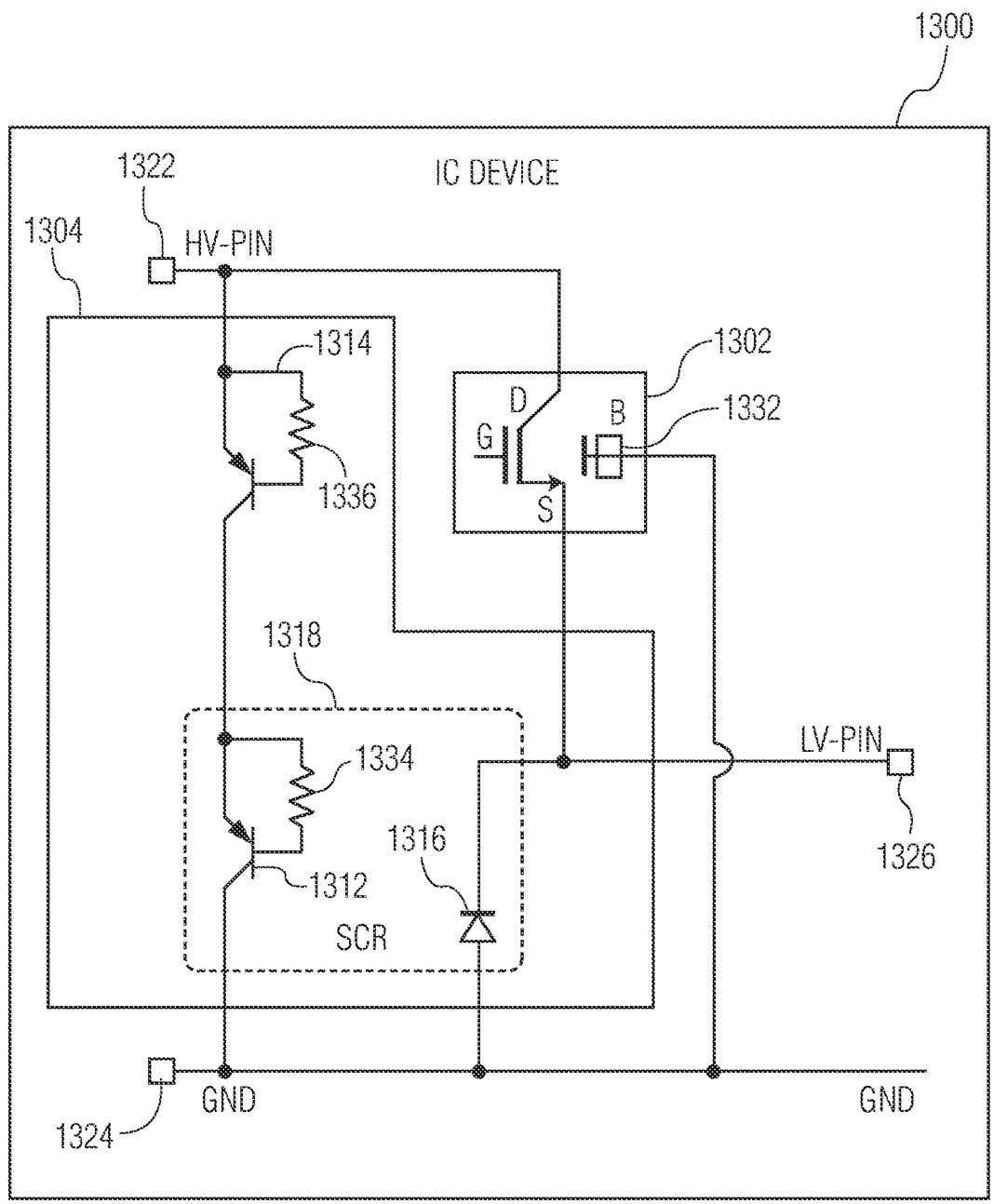
FIG. 13 depicts another embodiment of the IC device depicted in FIG. 1.

FIG. 13 depicts another embodiment of the IC device 100 depicted in FIG. 1. In the embodiment depicted in FIG. 4, an IC device 1300 includes an EDNMOS transistor 1302 and an ESD protection device 1304, which includes a first PNP bipolar transistor 1312, a second PNP bipolar transistor 1314, and a diode 1316. A difference between the PNP bipolar transistor 1312 depicted in FIG. 13 and the PNP bipolar transistor 412 depicted in FIG. 4 is that a resistor 1334 is connected between the base and the emitter of the PNP bipolar transistor 1312. A difference between the PNP bipolar transistor 1314 depicted in FIG. 13 and the PNP bipolar transistor 414 depicted in FIG. 4 is that a resistor 1336 is connected between the base and the emitter of the PNP bipolar transistor 1314. The EDNMOS transistor includes a source terminal, "S," a gate terminal, "G," a body, "B," 432, and a drain terminal, "D." In the embodiment depicted in FIG. 13, the drain terminal, D, of the EDNMOS transistor is electrically connected to a HV pin 1322 and to the second PNP bipolar transistor, the body, B, of the EDNMOS transistor is electrically connected to a ground (GND) pin 1324, to the first PNP bipolar transistor, and to the diode, and the source terminal, S, of the EDNMOS transistor is electrically connected to a LV pin 1326 and to the diode. In the embodiment depicted in FIG. 13, the diode 1316 and the first bipolar transistor 1312 form a parasitic silicon controlled rectifier (SCR) 1318. The EDNMOS transistor, the ESD protection device, the first PNP bipolar transistor, the second PNP bipolar transistor, and the diode of the IC device 400 depicted in FIG. 13 are embodiments of the NMOS device 102, the ESD protection device 104, the bipolar transistor device 112, the series protection device 114, and the diode device 116 of the IC device 100 depicted in FIG. 1, respectively. The IC device depicted in FIG. 13 is a possible implementation of the IC device 100 depicted in FIG. 1. However, the IC device depicted in FIG. 1 can be implemented differently from the IC device depicted in FIG. 13.

Figure 14:
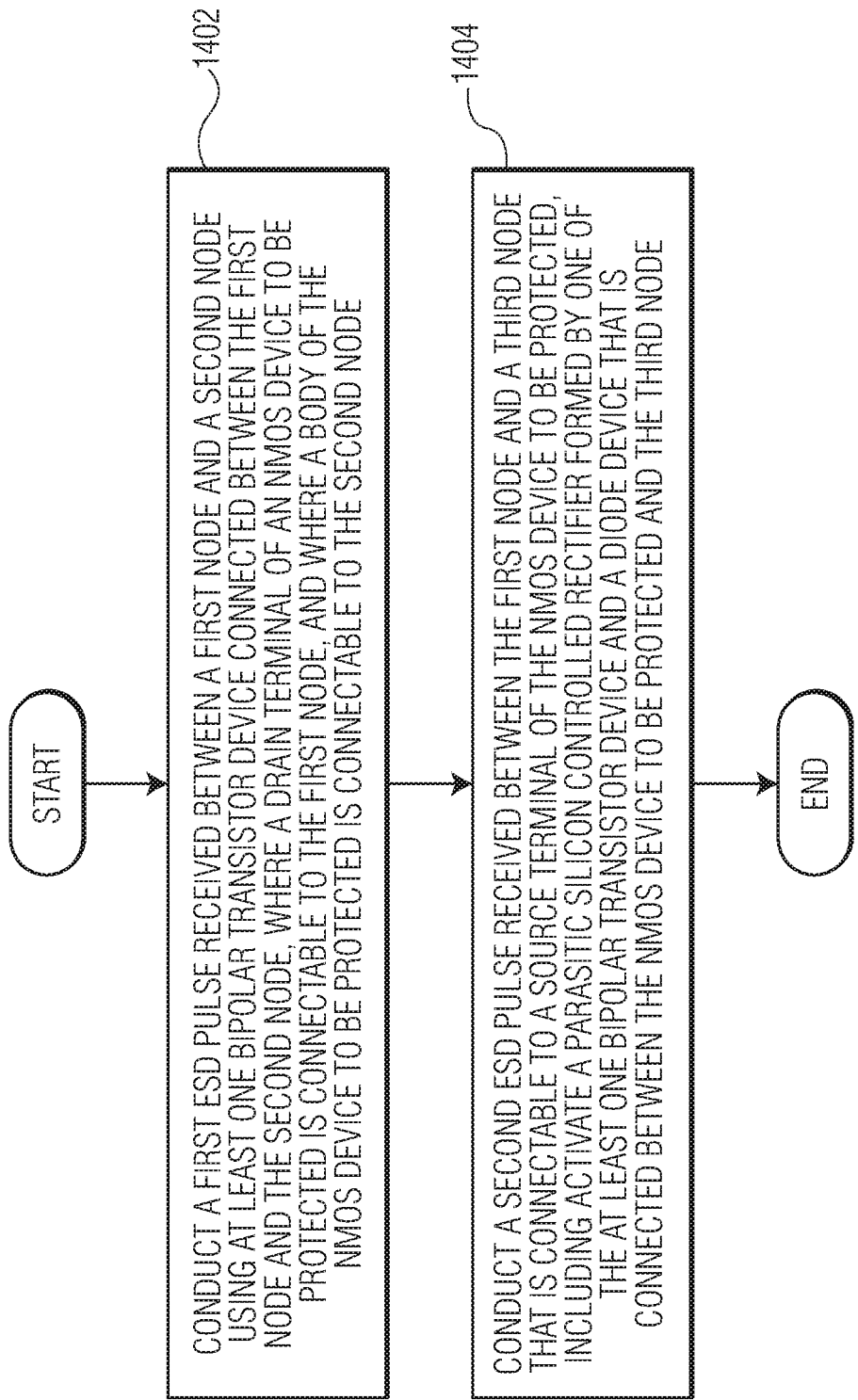
FIG. 14 is a process flow diagram that illustrates a method for operating an ESD protection device in accordance with an embodiment of the invention.

FIG. 14 is a process flow diagram that illustrates a method for operating an ESD protection device accordance with an embodiment of the invention. At block 1402, a first ESD pulse received between a first node and a second node is conducted using at least one bipolar transistor device connected between the first node and the second node. A drain terminal of an NMOS device to be protected is connectable to the first node, and a body of the NMOS device to be protected is connectable to the second node. At block 1404, a second ESD pulse received between the first node and a third node that is connectable to a source terminal of the NMOS device to be protected is conducted. A parasitic silicon controlled rectifier formed by one of the at least one bipolar transistor device and a diode device that is connected between the NMOS device to be protected and the third node is activated. The at least one bipolar transistor device may be the same as or similar to the bipolar transistor device 112 depicted in FIG. 1, the PNP bipolar transistors 412, 414 depicted in FIG. 4, the PNP bipolar transistors 812, 814 depicted in FIG. 8, the PNP bipolar transistors 912, 914 depicted in FIG. 9, and/or the PNP bipolar transistors 1312, 1314 depicted in FIG. 13. The NMOS device to be protected may be the same as or similar to the NMOS device 102 depicted in FIG. 1, the EDNMOS transistor 402 depicted in FIG. 4, the EDNMOS transistors 802-1, 802-2, 802-3 depicted in FIG. 8, the EDNMOS transistors 902-1, 902-2 depicted in FIG. 9, and/or the EDNMOS transistor 1312 depicted in FIG. 13. The diode device may be the same as or similar to the diode device 116 depicted in FIG. 1, the diode 416 depicted in FIG. 4, the diodes 816-1, 816-2, 816-3 depicted in FIG. 8, the diodes D_1b, D_2b depicted in FIG. 9, and/or the diode 1316 depicted in FIG. 13. The parasitic silicon controlled rectifier may be the same as or similar to the SCR 118 depicted in FIG. 1, the SCR 418 depicted in FIG. 4, the SCRs 818-1, 818-2, 818-3 depicted in FIG. 8, the SCRs 918-1, 918-2 depicted in FIG. 9, and/or the SCR 1318 depicted in FIG. 13.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. An electrostatic discharge (ESD) protection device, the ESD protection device comprising:
   a bipolar transistor device connected between a first node and a second node, wherein a drain terminal of an NMOS device to be protected is connectable to the first node, and wherein a body of the NMOS device to be protected is connectable to the second node;
   a series protection device connected in series with the bipolar transistor device; and
   a diode device connected between the second node and a third node, wherein a source terminal of the NMOS device to be protected is connectable to the third node; wherein the diode device and the bipolar transistor device are configured to form a parasitic silicon controlled rectifier.

2. The ESD protection device of claim 1, wherein a distance between the diode device and the bipolar transistor device is shorter than a predefined threshold.

3. The ESD protection device of claim 2, wherein the diode device overlaps with the bipolar transistor device.

4. The ESD protection device of claim 3, wherein the diode device is formed within a boundary of the bipolar transistor device.

5. The ESD protection device of claim 4, wherein the diode device is formed within a substrate contact ring of the bipolar transistor device.

6. The ESD protection device of claim 1, wherein the series protection device is connected to the first node, and wherein the bipolar transistor device is connected to the second node.

7. The ESD protection device of claim 1, wherein the bipolar transistor device comprises a PNP bipolar transistor or an NPN bipolar transistor.

8. The ESD protection device of claim 7, wherein the bipolar transistor device comprises a resistor connected between an emitter of the bipolar transistor device and a base of the bipolar transistor device.

9. The ESD protection device of claim 7, wherein the series protection device comprises a bipolar transistor or a diode.

10. The ESD protection device of claim 9, wherein the bipolar transistor comprises a resistor connected between an emitter of the bipolar transistor and a base of the bipolar transistor.

11. The ESD protection device of claim 9, wherein the diode device comprises at least one diode.

12. The ESD protection device of claim 1, wherein the parasitic silicon controlled rectifier is configured to be inactive in response to an ESD pulse received between the first node and the second node.

13. The ESD protection device of claim 11, wherein the parasitic silicon controlled rectifier is configured to be active in response to an ESD pulse received between the first node and the third node.

14. An integrated circuit (IC) device comprising the ESD protection device of claim 1 and the NMOS device to be protected.

15. An electrostatic discharge (ESD) protection device, the ESD protection device comprising:
    a first PNP bipolar transistor connected between a first node and a second node, wherein a drain terminal of an NMOS device to be protected is connectable to the first node, and wherein a body of the NMOS device to be protected is connectable to the second node;
    a second PNP bipolar transistor connected in series with the first PNP bipolar transistor; and
    a diode connected between the second node and a third node, wherein a source terminal of the NMOS device to be protected is connectable to the third node;
    wherein the first PNP bipolar transistor and the diode are configured to form a parasitic silicon controlled rectifier, and wherein the diode is formed within a boundary of the first PNP bipolar transistor.

16. The ESD protection device of claim 15, wherein the diode is formed within a substrate contact ring of the first PNP bipolar transistor.

17. The ESD protection device of claim 15, wherein the second PNP bipolar transistor is connected to the first node, and wherein the first PNP bipolar transistor is connected to the second node.

18. The ESD protection device of claim 17, wherein the parasitic silicon controlled rectifier is configured to be inactive in response to an ESD pulse received between the first node and the second node and to be active in response to an ESD pulse received between the first node and the third node.

19. The ESD protection device of claim 15, further comprising a second diode connected to the first node and to the second PNP bipolar transistor.

20. A method for operating an electrostatic discharge (ESD) protection device, the method comprising:

- conducting a first ESD pulse received between a first node and a second node using at least one bipolar transistor device connected between the first node and the second node, wherein a drain terminal of an NMOS device to be protected is connectable to the first node, and wherein a body of the NMOS device to be protected is connectable to the second node; and
- conducting a second ESD pulse received between the first node and a third node that is connectable to a source terminal of the NMOS device to be protected, wherein conducting the second ESD pulse comprises activating a parasitic silicon controlled rectifier formed by the bipolar transistor device and a diode device that is connected between the NMOS device to be protected and the third node.

* * * * *